United States Patent [19]

Kai

[11] Patent Number: 5,650,970
[45] Date of Patent: Jul. 22, 1997

[54] SEMICONDUCTOR MEMORY DEVICE HAVING A FLASH WRITE FUNCTION

[75] Inventor: Yasuyuki Kai, Yokohama, Japan

[73] Assignee: Kabushiki Kaisha Toshiba, Tokyo, Japan

[21] Appl. No.: 533,718

[22] Filed: Sep. 26, 1995

[30] Foreign Application Priority Data

Nov. 15, 1994 [JP] Japan .................................. 6-280418

[51] Int. Cl.$^6$ ...................................................... G11C 7/00
[52] U.S. Cl. .......................... 365/203; 365/233; 365/149
[58] Field of Search ................................ 365/149, 203, 365/233

[56] References Cited

U.S. PATENT DOCUMENTS

| | | | |
|---|---|---|---|
| 4,811,301 | 3/1989 | Houston | 365/203 |
| 4,813,021 | 3/1989 | Kai et al. | 365/203 |
| 5,010,518 | 4/1991 | Toda | 365/149 |
| 5,255,243 | 10/1993 | Kitazawa | 365/233 |
| 5,404,325 | 4/1995 | Shibata | 365/149 |
| 5,495,443 | 2/1996 | Koike | 365/149 |

*Primary Examiner*—David C. Nelms
*Assistant Examiner*—Michael T. Tran
*Attorney, Agent, or Firm*—Loeb & Loeb LLP

[57] ABSTRACT

In a VRAM having a flash write function, paired bit lines in a memory cell array are divided into first paired bit lines on the side of memory cells and a pre-charge equalizing circuit, and second paired bit lines on the side of paired column selecting transfer gates, by paired bit line transfer gates. One end of first and second flash write MOS transistors is connected to bit lines of the second paired bit lines. The other ends are set at a bit line pre-charge potential or a predetermined reference potential by a potential changeover circuit. With the potential changeover circuit, not only the original flash write function but also a bit line equalizing function can be carried out. Thus, it is possible to pre-charge bit lines sufficiently in a short period of time even when the power source potential is low, and to sense data read from memory cells with precision.

13 Claims, 7 Drawing Sheets

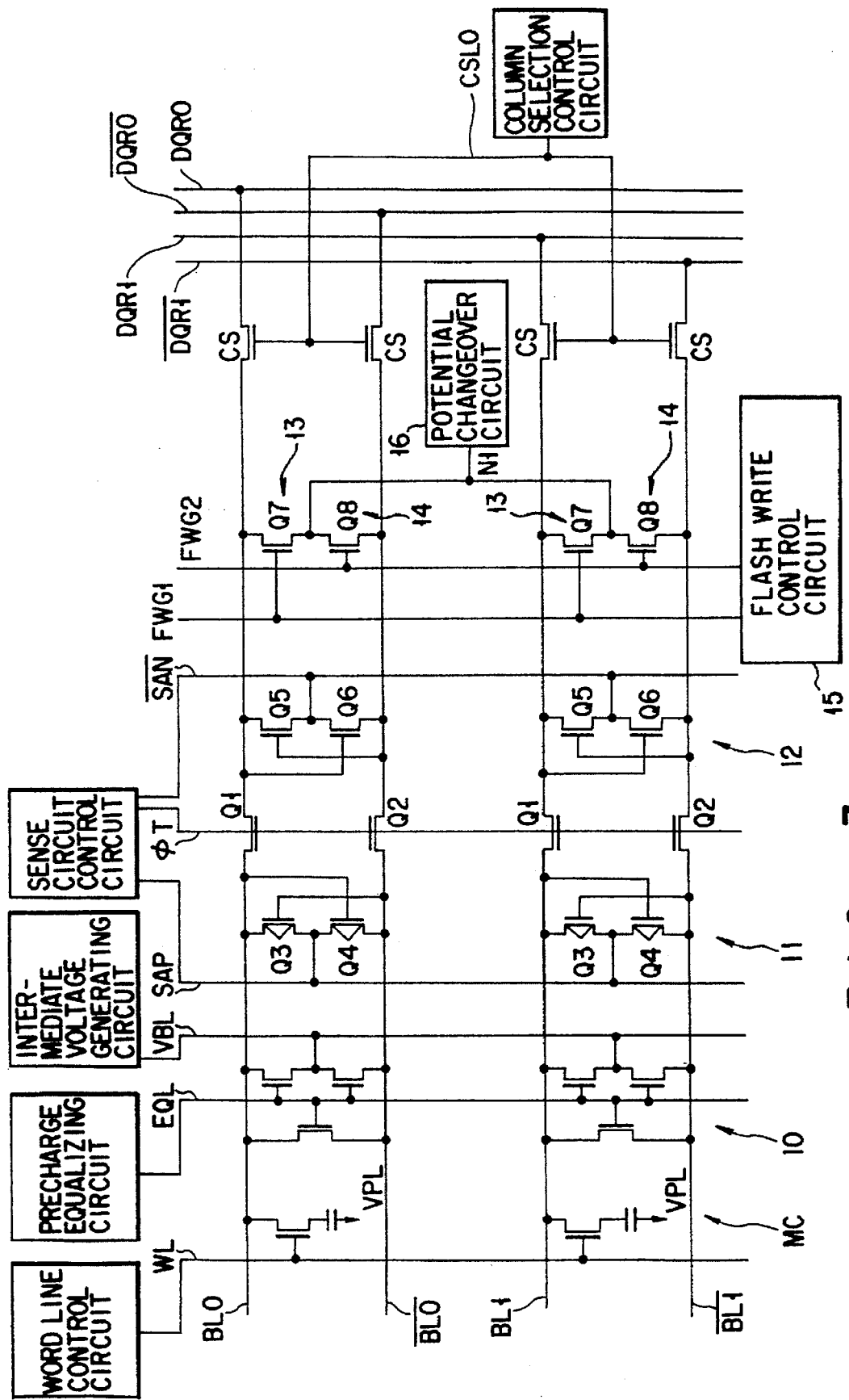
F I G. 3

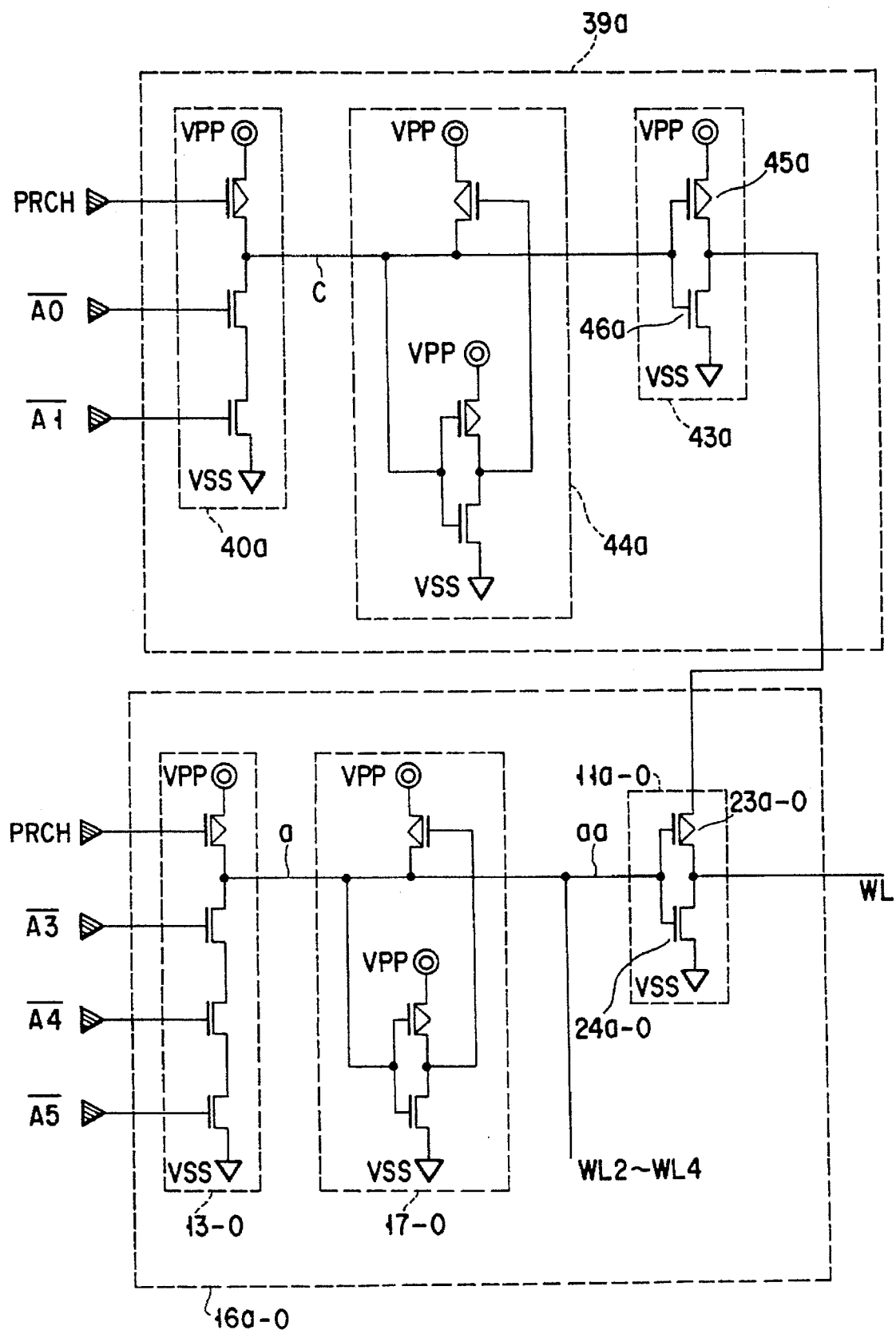
F I G. 4

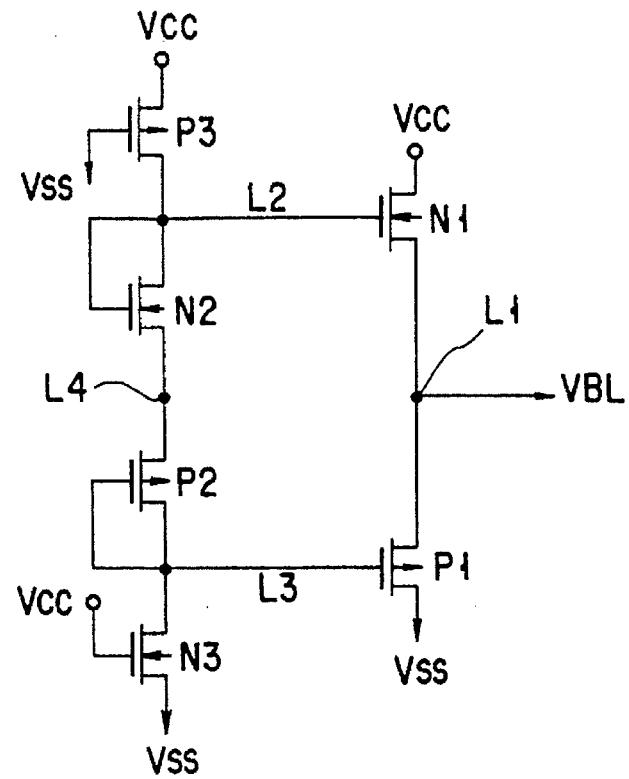
F I G. 6
F I G. 7
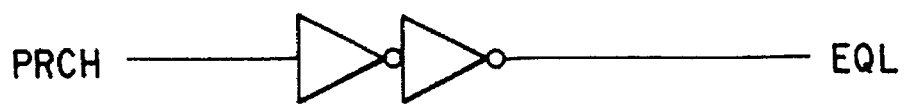
F I G. 8

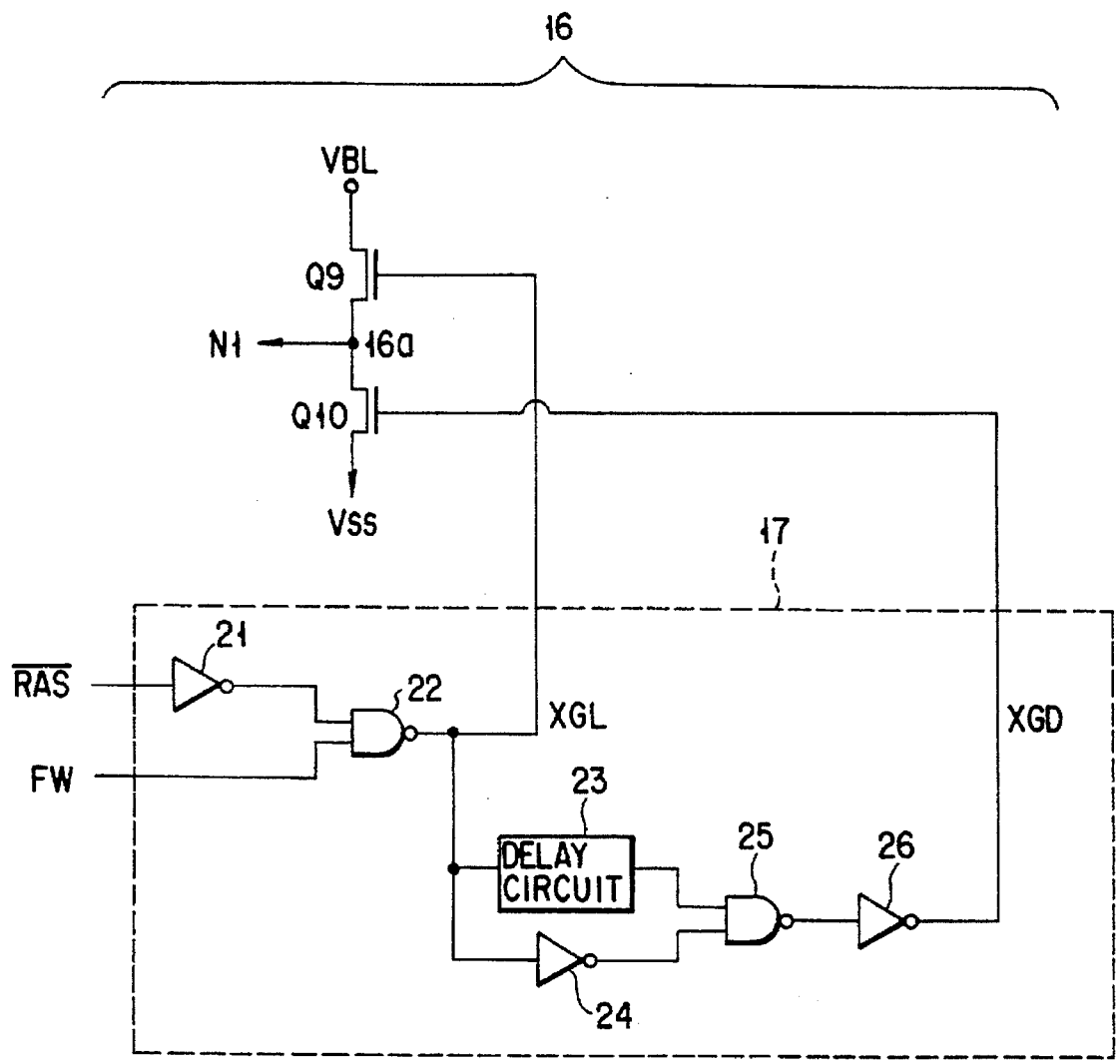
F I G. 10

SEMICONDUCTOR MEMORY DEVICE HAVING A FLASH WRITE FUNCTION

BACKGROUND OF THE INVENTION

1. Field of the Invention

The present invention relates to a semiconductor memory device and, more particularly, to a semiconductor memory device having a flash write function such as a VRAM (VIDEO Random Access Memory) for storing image data.

2. Description of the Related Art

FIG. 1 shows part of a memory cell array constituting a core of the conventional VRAM, where only two columns are shown for the sake of simplification of description.

In FIG. 1, MC is a dynamic memory cell, WL is a word line, where two MCs and one WL are illustrated by way of example. Paired complementary bit lines (BLi, /BLi) are connected to a pair of data lines of plural paired data lines (DQRi, /DQRi) through paired bit line transfer gates (Q1, Q2) and paired column selecting transfer gates (CS, CS), respectively.

FIG. 2 exemplifies how main signals vary with time to describe an example of the circuit operation of FIG. 1.

Now, an example of the circuit operation shown in FIG. 1 will be briefly described, with reference to FIG. 2.

First, when /RAS (row address strobe) signal is at "H" level (i.e. in a non-active state), the equalizing signal EQL turns into "H" level (i.e. in an active state), so that the equalizing circuit 10 turns into an ON state. The first paired bit lines on the side of the P-channel sense amplifier are thereby pre-charged and equalized to have the bit line potential VBL through the equalizing circuit 10. The second paired bit lines on the side of the N-channel sense amplifier are pre-charged with the bit line potential VBL through the paired bit line transfer gates (Q1, Q2).

When /RAS signal is at "L" level (i.e. in an active state) and a row address is fetched, the EQL signal turns into "L" level (i.e. in a non-active state), so that the equalizing circuit 10 turns into an OFF state. Bit lines are thereby disconnected from the power source potential VCC, the ground potential VSS and the bit line potential VBL. If a word line which corresponds to the fetched row address is selected, memory cell data on the selected row is read on the bit lines. In addition, when the sense amplifier 12 operates, the potential difference between the paired bit lines is amplified. When the sense amplifier 11 operates, the potential of the paired bit lines is determined.

When /RAS signal is back to "H" level, the EQL is back to "H" level, too, so that the equalizing circuit 10 turns into an ON state. Whereby, the first paired bit lines are again pre-charge equalized to have the bit line potential VBL through the equalizing circuit 10. The paired second bit lines are pre-charged with the bit line potential VBL through the paired bit line transfer gates (Q1, Q2).

The above-described operation requires the bit lines to be sufficiently equalized before the sense amplifier 12 starts operating. That is, the paired bit lines need to be pre-charged with the bit line potential VBL through the paired bit line transfer gates (Q1, Q2).

In this regard, in a region where the power source potential VCC is high, e.g. 5 V, the capacity of the bit line transfer gate transistors (Q1, Q2) is sufficient and the threshold voltage Vth is relatively lower than the power source potential VCC. As a result, the second paired bit lines are sufficiently pre-charged with the bit line potential VBL in a short period of time.

Conversely, however, in a range where the power source potential VCC is low, the capacity of the bit line transfer gate transistors (Q1, Q2) is not sufficient and the threshold voltage Vth is not small enough to be negligible compared with the power source potential VCC. As a result, it becomes difficult that the second paired bit lines are sufficiently pre-charged with the bit line potential VBL in a short period of time. Unless the second paired bit lines are sufficiently pre-charged as mentioned above, the margin of a sense operation in the next cycle is greatly decreased. This might cause erroneous sensing of data read from the memory cells.

The first conceivable measure to solve the above problem is to prevent a decrease in potential by the threshold voltage Vth of the transistors, by removing the bit line transfer gate transistors (Q1, Q2) and to thereby sufficiently pre-charge the second paired bit lines.

Nonetheless, if the bit line transfer gate transistors (Q1, Q2) are removed, an apparent bit line capacity at the time of the initial sense operation of the sense amplifier 12 becomes large to such an extent as to make a high-speed, reliable sense operation difficult.

Furthermore, the second measure is to increase the gate potential of the bit line transfer gate transistors (Q1, Q2) to a potential greater than VCC+Vth only for a predetermined period of time, e.g. while the /RAS signal is at "H" level. This allows the transistors (Q1, Q2) to operate in a triode region to compensate for reduced potential caused by the threshold voltage Vth of the transistors (Q1, Q2), thereby pre-charging the second paired bit lines sufficiently.

If trying to increase the gate potential of the whole bit line transfer gate transistors (Q1, Q2) in the memory cells to be greater than VCC+Vth in a short period of time to activate them, a voltage booster circuit employing a large-capacity, large-size capacitor is needed. Besides, since the VRAM usually operates in an asynchronous manner, there is a strong possibility that the voltage booster circuit malfunctions by the operation of the serial access memory (SAM) port, in particular, by the power source noise which occurs at a time when data is output.

As described above, the conventional semiconductor memory device has had such disadvantages that it is difficult to sufficiently pre-charge bit lines, in a range where the power source potential is low, during a short period of time and that the margin of a sense operation is greatly decreased with the result that erroneous data is likely to be sensed.

SUMMARY OF THE INVENTION

The present invention has been made in consideration of the above circumstances, and its object is to provide a semiconductor memory device which is capable of pre-charging bit lines reliably enough in a short period of time even in a region where the power source potential is low, and of sensing and outputting data read from memory cells precisely, without increasing the number of circuits within the memory cell array and by only adding to the device such a potential changeover circuit as to have a relatively simple structure and to be tolerant of noise.

To attain the above object, a semiconductor memory device according to the present invention comprises: a memory cell array having memory cells of dynamic type arranged in rows and columns; a plurality of complementary paired bit lines connected to the memory cells on the same columns; a plurality of paired column selecting transfer gates connected to one end of the paired bit lines; a plurality of paired data lines connected to the paired column selecting transfer gates; a plurality of paired bit line transfer gates of first conductivity type, the paired bit line transfer gates being inserted to lines of the paired bit lines in series, respectively and dividing the paired bit lines into first paired bit lines on the side of the memory cells and second paired bit lines on the side of the paired column selecting transfer gates; a plurality of bit line pre-charge equalizing circuits connected to the first paired bit lines and controlled to be in an ON state during a pre-charge equalizing period; a first sense amplifier for restoring a bit line potential, having two MOS transistors of second conductivity type, which are connected to the first paired bit lines, cross-coupled and driven for a predetermined period of time; a second sense amplifier for sensing potential difference between the paired bit lines, having two MOS transistors of first conductivity type, which are connected to the second paired bit lines, cross-coupled and driven for a predetermined period of time; a plurality of first and second flash write MOS transistors, one end of the MOS transistors being connected to lines of the second paired bit lines; a flash write control circuit switching and controlling the first and second MOS transistors in accordance with write data during the pre-charge equalizing period, a non-flash write mode and a flash write mode; and a potential changeover circuit, having an output node connected to the other ends of the first and second MOS transistors and capable of setting a potential of the output node at one of a bit line pre-charge potential for setting a bit line initial potential and a predetermined reference potential.

With the potential changeover circuit, not only the original flash write function but also a bit line equalizing function can be carried out. The potential changeover circuit has noise-tolerant characteristics with a relatively simple structure.

The semiconductor memory device of the present invention, if provided only with the above-mentioned potential changeover circuit, is capable of pre-charging bit lines sufficiently in a short period of time even in a region where the power source potential is low, and of sensing data read from memory cells with precision.

Additional objects and advantages of the invention will be set forth in the description which follows, and in part will be obvious from the description, or may be learned by practice of the invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and together with the general description given above and the detailed description of the preferred embodiment given below serve to explain the principles of the invention.

FIG. 3 is a circuit diagram illustrating part of the memory cell array constituting the core portion of the VRAM according to the first embodiment of the present invention;

FIG. 4 is a circuit diagram illustrating a word line control circuit of the conventional VRAM;

FIG. 6 is a circuit diagram illustrating an intermediate voltage generating circuit of the conventional VRAM;

FIG. 7 is a circuit diagram illustrating a column selection control circuit of the conventional VRAM.

FIG. 8 is a circuit diagram illustrating a pre-charge equalizing circuit of the conventional VRAM;

FIG. 10 is a circuit diagram illustrating an example of a potential changeover circuit.

DETAILED DESCRIPTION OF PREFERRED EMBODIMENTS

Figure 1:
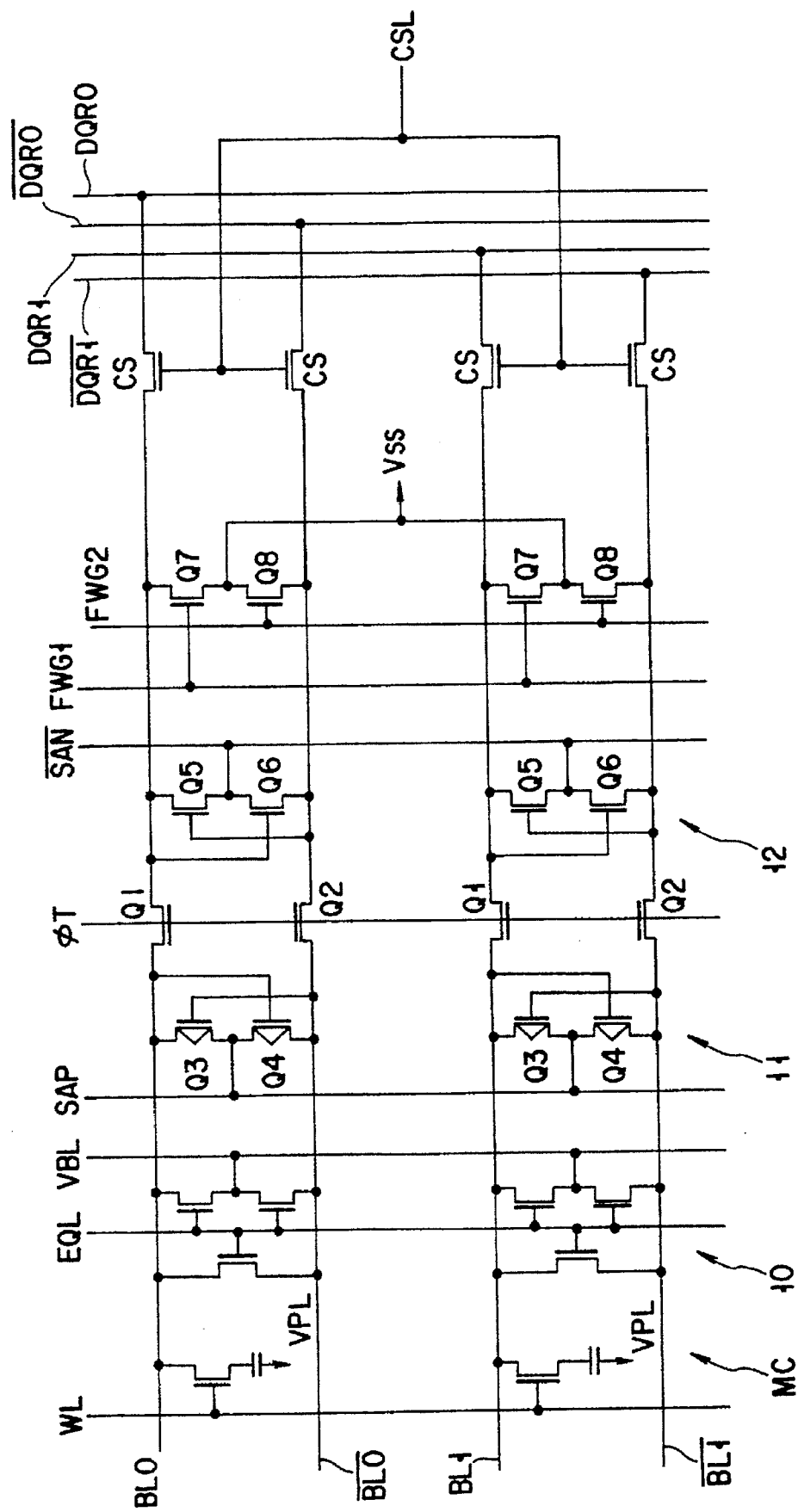
FIG. 1 is a circuit diagram illustrating part of a memory cell array constituting a core portion of the conventional VRAM.
Figure 2:
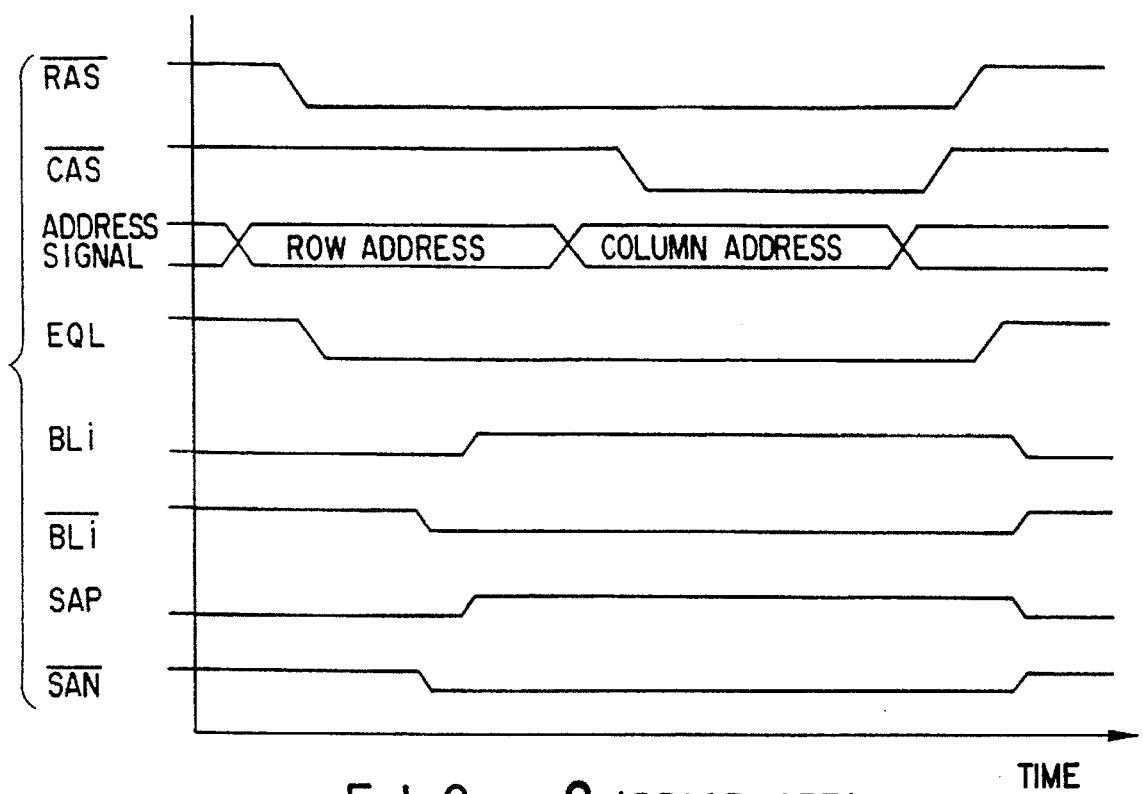
FIG. 2 exemplifies how main signals vary with time to describe an example of the circuit operation shown in FIG. 1.

Embodiments of the present invention will now be described with reference to the drawings.

FIG. 3 shows a part of a memory cell array constituting a core portion of a VRAM having a flash write function according to the first embodiment of the present invention, where only two columns are shown for the sake of simplification of description.

In FIG. 3, MC is a memory cell of dynamic type, where only two memory cells are shown for the sake of simplification of the drawing. They are arranged in rows and columns to constitute a memory cell array. The capacitors thereof are supplied with capacitor plate potential. WL is a word line (only one typical word line is illustrated) connected to memory cells on the same column of the memory cell array and is selectively driven by a word line drive signal. BL0, BL0 and BL1, /BL1, where only two pairs are illustrated, are complementary paired bit lines each connected to memory cells on the same row.

CS and CS are column selecting transfer gates connected to one end of lines of the paired bit lines, and are selected by a common column selecting signal CSLi (CSL0 in this embodiment). Paired column selecting transfer gates (CS, CS) on a plurality of predetermined columns are selected in common by the column selecting signal CSL0.

DQR and /DQRi are paired data lines connected to the other ends of the paired column selecting transfer gates (CS, CS), and express a plurality of paired data lines (DQR0, /DQR0), (DQR1, /DQR1) and the like connected to the plurality of columns selected in common.

Q1 and Q2, which are inserted in series into lines of the paired bit lines, denote paired bit line transfer gates each consisting of an N-channel MOS transistor for dividing the paired bit lines into first paired bit lines on the side of a memory cell and second paired bit lines on the side of the column selecting transfer gates. Q1 and Q2 are driven in common by the bit line transfer gate control signal φT.

Bit line pre-charge equalizing circuit 10 is connected to the first paired bit lines and controlled to be in an ON state by equalizing signal EQL during a pre-charge equalizing period.

P-channel sense amplifier 11 for restoring bit line potential is connected to the first paired bit lines, and consists of two cross-coupled P-channel MOS transistors Q3 and Q4, which are driven by sense enable signal SAP.

N-channel sense amplifier 12 for sensing the potential difference between the paired bit lines is connected to the second paired bit lines, and consists of two cross-coupled N-channel MOS transistors Q5 and Q6, which are driven by sense enable signal /SAN.

FIG. 4 shows a word line selecting circuit 16a-0 and a word line drive selecting signal circuit 39a. Pre-charge signal PRCH and row address signals /A3, /A4 and /A5 are input to main row decoder 13-0. Upon coincidence of an address, node a is selected. Reference numeral 17-0 denotes a noise killer circuit. The pre-charge signal PRCH and row address signals /A0 and /A1 are input to partial decoder 40a. Upon coincidence of an address, node c is selected. Reference numeral 44a denotes a noise killer circuit. Reference numeral 11a-0 denotes a word line drive circuit, the output of which is connected to the WL. The power source of the word line drive circuit 11a-0 is connected to drive signal line drive signal circuit 43a and VSS. Boosted potential VPP is thereby supplied to the WL, if selected, in a write mode.

Bit line pre-charge equalizing circuit 10 and P-channel sense amplifier 11 for restoring bit line potential are connected to paired bit lines (first paired bit lines), which are provided between memory cells MCs and paired bit line transfer gates (Q1, Q2).

N-channel sense amplifier 12 for sensing potential between the paired bit lines, and one end of first and second NMOS transistors Q7 and Q8 for use in flash write, are connected to paired bit lines (second paired bit lines), which are provided between the paired transfer gates (Q1, Q2) and the paired column selecting transfer gates (CS, CS). The other ends of the first and second NMOS transistors Q7 and Q8 are connected in common to a ground potential (VSS) node.

VPL is a capacitor plate potential; VBL is a bit line pre-charge potential; EQL is an equalizing signal; SAP is a sense enable signal for use in the P-channel sense amplifier; /SAN is a sense enable signal for use in the N-channel sense amplifier; $\phi$T is a bit line transfer gate control signal; FWG1 is a first flash write signal; FWG2 is a second flash write signal; and CSL is a column selecting signal.

Figure 5:
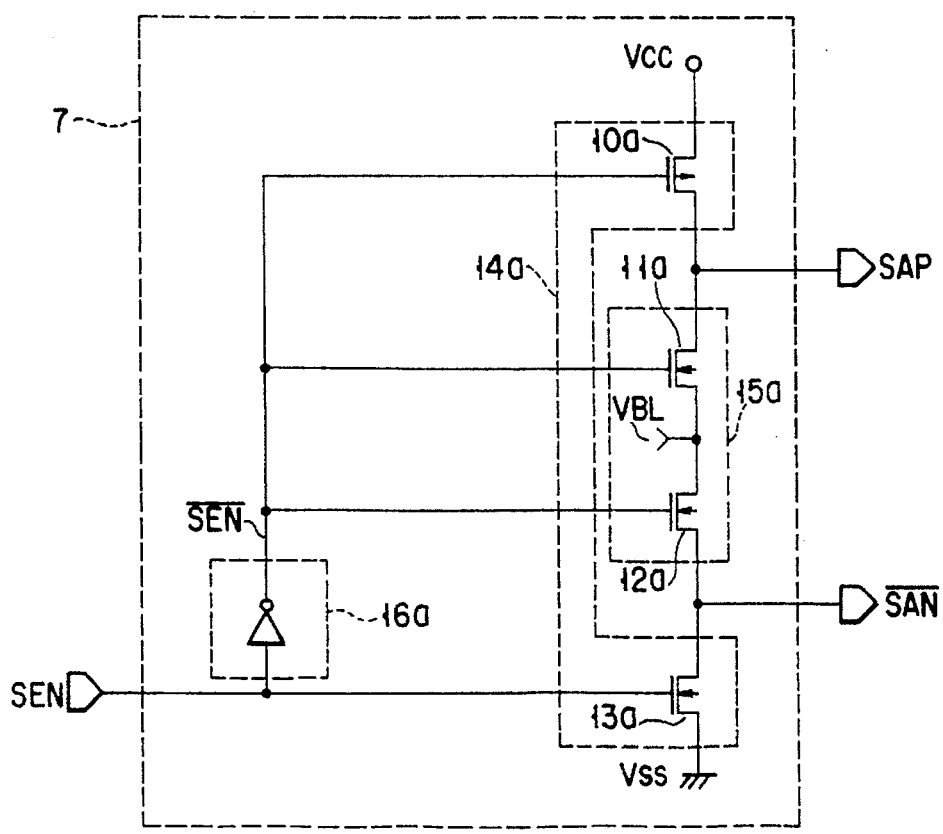
FIG. 5 is a circuit diagram illustrating a sense circuit control circuit of the conventional VRAM.

FIG. 5 shows sense amplifier drive circuit 7. The circuit 7 includes PMOS 10a for supplying, as a drive signal, a potential of VCC level to the drive signal line SAP; NMOS 13a for supplying, as a drive signal, a potential of VSS level (GND) to the drive signal line /SAN; NMOS 11a for supplying, as a pre-charge potential, a potential of VBL level (about VCC/2 level) to the drive signal line SAP; and NMOS 12a for supplying, as a pre-charge potential, a potential of about VBL level to the drive signal line /SAN. The PMOS 10a and NMOS 13a are constituents of sense amplifier driver unit 14a, and the NMOS 11a and NMOS 12a are constituents of sense amplifier charger unit 15a.

FIG. 6 shows an intermediate potential generation circuit. This circuit consists of PMOS transistors P1, P2 and P3, and NMOS transistors N1, N2 and N3. The gate and drain of the PMOS transistor P2 are connected to node L3, and its source is connected to node L4 (a source of the PMOS transistor P2). The current path of the PMOS transistor P3 is inserted between the power source VCC and node L2, and its gate is connected to the ground VSS. The current path of the NMOS transistor N3 is inserted between the node L3 and the ground VSS, and its gate is connected to the power source VCC. Current paths of the four transistors P3, N2, P2 and N3 are connected in series. Potential V2, V3 and V4 of the respective nodes L2, L3 and L4 thereby serve as intermediate potentials, the relation of which is represented by VCC>V2>V4>V3>ground potential VSS in DC value.

FIG. 7 shows a column decoder circuit. Input addresses A, B and C are, upon coincidence, output to CSLO.

FIG. 8 is an equalizing signal circuit. The pre-charge signal PRCH is input and, with a time lag, a signal is output to EQL.

First flash write circuit 13 and second flash write circuit 14 are connected to lines of the second paired bit lines, respectively.

According to this embodiment, the first flash write circuit 13 consists of first MOS transistor Q7 of N-channel type for use in flash write, one end of which is connected to a first line of each of the paired bit lines (BL0 or BL1). Likewise, the second flash write circuit 14 consists of second MOS transistor Q8 of N-channel type for use in flash write, one end of which is connected to a second line of each of the paired bit lines (/BL0 or /BL1).

The two MOS transistors Q7 and Q8 are switched by a flash write control circuit in accordance with write data in a non-flash write mode as well as a flash write mode and a pre-charge equalizing period. The constitution of flash write control circuit 15 is shown by, for example, FIG. 9.

During the pre-charge equalizing period while /RAS input is non-active, the flash write control circuit 15 controls FWG1 and FWG2 to be active so as to control the first and second MOS transistors Q7, Q8 to be in an ON state. In a non-flash mode while FW input is non-active, the circuit 15 controls FW input to be non-active and FWG1 and FWG2 to be non-active so as to control the first and second MOS transistors Q7 and Q8 to be in an OFF state. In a flash write mode, the circuit 15 has such a logical constitution as to generate the first flash write signal FWG1 and the second flash write signal FWG2 for controlling either one of the first and second MOS transistors Q7 and Q8 to be in an ON state for a predetermined period of time before the sense amplifier 12 is driven. In other words, if RAS input and FW input are active and RWD is active, the FWG1 is controlled to be in an active state for a predetermined period of time, so that the first MOS transistor Q7 is turned on. If BRWD is active on a similar condition, the FWG2 is controlled to be in an ON state for a predetermined period of time, so that the second MOS transistor Q8 is turned on.

Potential changeover circuit 16 has an output node connected to the other ends of the first and second MOS transistors Q7, Q8. The circuit 16 sets the potential of the output node at bit line pre-charge potential VBL for setting a bit line initial potential or a predetermined reference potential (i.e. ground potential VSS in this embodiment). The circuit 16 is constituted, for example, as shown in FIG. 10.

Namely, the potential changeover circuit 16 includes second NMOS transistor Q9 of N-channel type which is connected between a VBL node supplied with the bit line pre-charge potential VBL and the output node 16a, and the gate of which is provided with first control signal XGL. It also includes fourth NMOS transistor Q10 of N-channel type which is connected between a VSS node supplied with the predetermined reference potential VSS and the output node 16a, and the gate of which is provided with second control signal XGD, and control signal generation circuit 17 for generating the first control signal XGL and the second control signal XGD.

The control signal generation circuit 17 is provided with VCC and VSS as an operating power source. It has a logical constitution in which during the pre-charge equalizing period and in a non-flash write mode, the third NMOS transistor Q9 is controlled to be in an ON state and the fourth NMOS transistor Q10 is controlled to be in an OFF state, and in a flash write mode, the third NMOS transistor Q9 is controlled to be in an OFF state and the fourth NMOS transistor Q10 to be in an ON state for a predetermined period of time before the sense amplifier is driven.

Specifically, the circuit 17 consists of, as shown in FIG. 10, for example, inverter circuit 21 for inverting /RAS signal; NAND gate circuit 22 for outputting the first control signal XGL by obtaining a logical product of the output signal of the inverter circuit 21 and flash write mode recognition signal FW; delay circuit 23 for delaying the control signal XGL by a predetermined period of time; NAND gate circuit 25 for obtaining a logical product of the output signal of inverter circuit 24 and the output signal of the delay circuit 23; and inverter circuit 26 for inverting the output signal of the NAND gate circuit 25 and for outputting the control signal XGD. The control signals XGL and XGD have, if at "H" level, VCC and, if at "L" level, VSS.

Since the two NMOS transistors Q9 and Q10 of the potential changeover circuit 16 are provided outside the memory cell array, the circuit arrangement of the memory cell array itself is the same as that of the conventional one.

Figure 9:
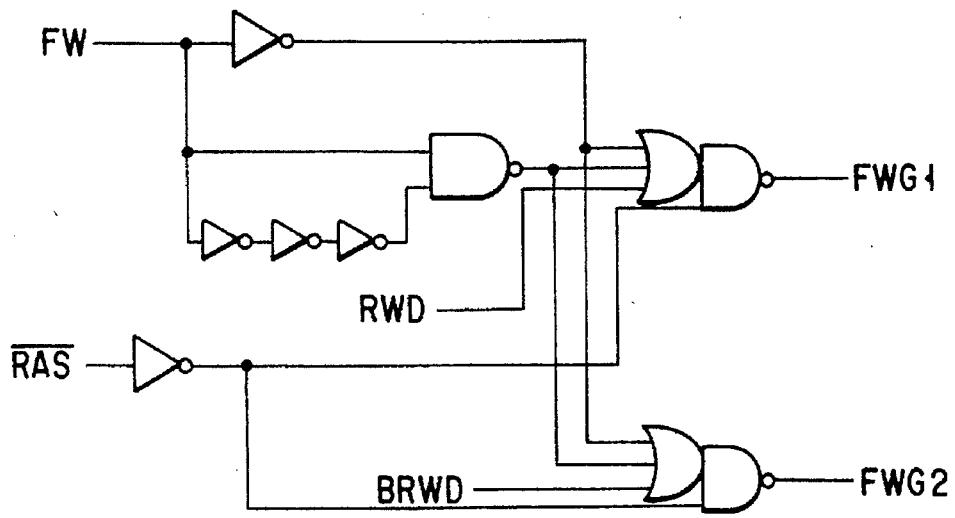
FIG. 9 is a circuit diagram illustrating an example of a flash write control circuit shown in FIG. 3.

Examples of circuit operations as shown in FIGS. 3, 9 and 10 will now be described with reference to FIG. 11.

Figure 11:
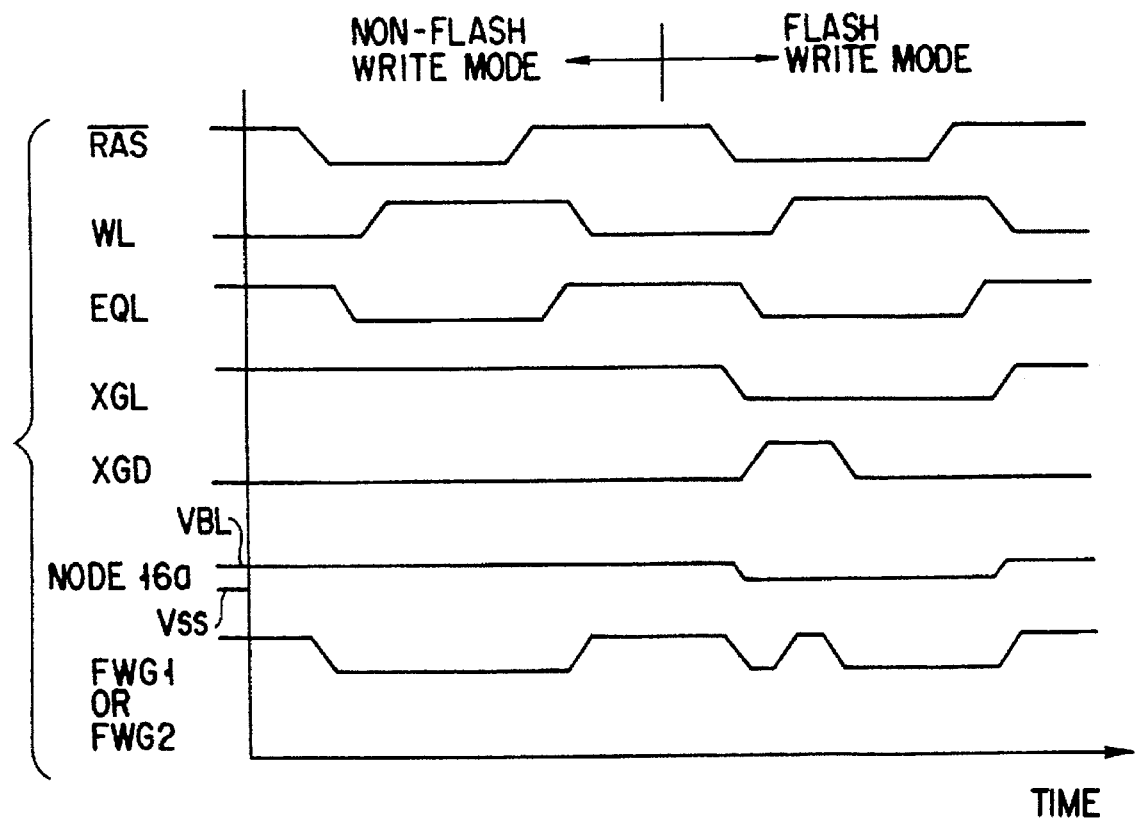
FIG. 11 exemplifies how main signals vary with time to describe an example of the circuit operation shown in FIGS. 3, 9 and 10.

FIG. 11 exemplifies how major signals in the non-flash write mode and in the flash write mode vary with time.

First, explanation will be given of the operation in the non-flash write mode. When the /RAS signal is at "H" level (i.e. in a non-active state), the equalizing signal EQL turns into "H" level (VCC) and the pre-charge equalizing circuit 10 goes into an ON state.

At this time, the control signal XGL has a potential of VCC and the control signal XGD has a potential of VSS. The NMOS transistor Q9 of the potential changeover circuit 16 turns into an ON state and the NMOS transistor Q10 thereof into an OFF state, so that the output node 16a has a potential of VBL.

Also, the flash write signals FWG1 and FWG2 are at "H" level (i.e. have a potential of VCC). Both the first and second flash-write transistors Q7 and Q8 are in an ON state.

As a result, the paired bit lines on the side of the P-channel sense amplifier 11 are pre-charge equalized to have the bit line potential VBL through the pre-charge equalizing circuit 10. The paired bit lines on the side of the N-channel sense amplifier 12 are pre-charged with bit line potential VBL through the potential changeover circuit 16, the first flash write transistor Q7 and the second flash write transistor Q8.

At this time, the control signal φT is at "H" level (i.e. has a potential of VCC) and the bit line transfer gates Q1 and Q2 are in an ON state, so that the paired bit lines on the side of the N-channel sense amplifier 12 and those on the side of the P-channel sense amplifier are equalized to have the same potential VBL through the bit line transfer gates Q1 and Q2.

When the /RAS signal turns into "L" level (i.e. an active state) and a row address is fetched, the EQL signal and the flash write signals FWG1 and FWG2 turns into "L" level (i.e. a non-active state) and the pre-charge equalizing circuit 10 goes into an OFF state. As a result, the bit lines are disconnected from the power source VCC, the ground potential VSS and the bit line potential VBL. Besides, as mentioned before, when a word line which corresponds to the fetched row address is selected, memory cell data on the selected row is read on the bit line and the sense amplifiers 11 and 12 starts operating, thereby amplifying the potential difference between the paired bit lines.

When the /RAS signal is back to "H" level, the EQL signal and the flash write signals FWG1, FWG2 are also back to "H" level, so that the pre-charge equalizing circuit 10 and the first and second flash write transistors Q7, Q8 turn into an ON sate. As a result, the paired bit lines on the side of the P-channel sense amplifier 11 are pre-charge equalized to have the bit line potential VBL through the pre-charge equalizing circuit 10. The paired bit lines on the side of the N-channel sense amplifier 12 are pre-charged with the bit line potential VBL through the potential changeover circuit 16, and the first and second flash write transistors Q7 and Q8. Here, since the control signal φT is at "H" level and the bit line transfer gates Q1 and Q2 are in an ON state, the paired bit lines on the side of the N-channel sense amplifier 12 and those on the side of the P-channel sense amplifier 11 are equalized to have the same potential VBL through the bit line transfer gates Q1 and Q2.

As mentioned above, in the non-flash write mode, the paired bit lines on the side of the N-channel sense amplifier 12 are pre-charged with the bit line potential VBL through the potential changeover circuit 16 and the first and second flash write transistors Q7 and QS. This allows the bit lines to be sufficiently and reliably pre-charged in a shorter time than in the conventional device.

Furthermore, in the non-flash write mode, the potential of the output node 16a of the potential changeover circuit 16 is constantly VBL, so charge and discharge do not occur, and current is not thereby consumed.

Next, explanation will be given of the operation in the flash write mode. When the /RAS signal is at "H" level, the equalizing signal EQL is at "H" level, the control signal XGL has a potential of VCC, the control signal XGD has a potential of VSS, and the flash write signals FWG 1 and 2 turn into "H" level. The operation is the same between the flash write mode and the non-flash write mode until the paired bit lines on the side of the P-channel sense amplifier 11 and those on the side of the N-channel sense amplifier 12 are pre-charge equalized to have the bit line potential VBL.

When the /RAS signal is at "L" level and it is determined that the circuit is in the flash write mode, the flash write mode recognition signal FW is set at "H" level by a function decoder (not shown). At this time, the control signal XGL is VSS in potential and the NMOS transistor Q9 of the potential changeover circuit 16 is in an OFF state. When a row address is fetched, the EQL signal first turns into "L" level and the pre-charge equalizing circuit 10 then turns into an OFF state, thereby disconnecting bit lines from the power source potential VCC, the ground potential VSS and the bit line potential VBL. The XGL signal and the flash write signals FWG1, FWG2 turn into "L" level and the first and second flash write transistors Q7 and Q8 go into an OFF state.

Before the flash write operation actually starts, the XGD signal turns into VCC in potential, the NMOS transistor Q10 of the potential changeover circuit 16 goes into an ON state and the output node 16a goes to VSS. If a word line which corresponds to the fetched row address is selected, memory cell data on the selected row is read on the bit line. Almost simultaneously with the operation, either the flash write signal FWG1 or FWG2 turns into "H" level and either the first flash write transistor Q7 or the second flash write transistor Q8 turns into an ON state.

If data "0" is to be written in all the memory cells connected to the selected word line WL, the flash write signal FWG1 turns into "H" level so as to make the first flash write transistor Q7 connected to the first line of each of the paired bit lines, such as BL0 and BL1, go into an ON state. Therefore, even if data "1" is previously written in the memory cells, the first line of each of the paired bit lines, such as BL0 and BL1, is discharged to be VSS in potential by turning on the first flash write transistor Q7. It is thereby definitely lower in potential than the second line of each of the paired bit lines such as /BL0 and /BL1.

On the other hand, if data "1" is to be written in all the memory cells connected to the selected word line WL, the flash write signal FWG2 turns into "H" level so as to make the second flash write transistor Q8 connected to the second line of each of the paired bit lines, such as /BL0 and /BL1, go into an ON state. Therefore, even if data "0" is previously written in the memory cells, the second line of each of the paired bit lines, such as /BL0 and /BL1, is discharged to be VSS in potential by turning on the second flash write transistor Q8. It is thereby definitely lower in potential than the first line of each of the paired bit lines, such as BL0 and BL1.

After the potential difference between the paired bit lines occurs to a certain degree, the flash write mode recognition signal FW turns into "L" level, the control signal XGD goes to VSS in potential and the NMOS transistor Q10 of the potential changeover circuit 16 goes into an OFF state.

Later, the sense amplifiers 11 and 12 start operating and the potential difference between the paired bit lines is amplified. Since potentials of all the bit lines are shifted to the same potential, the same data is eventually written in all the memory cells connected to the selected word line.

Now, when the /RAS signal turns into "H" level again, the EQL signal as well as the flash write signals FWG1 and FWG2 are back to "H" level and the control signal XGL is back to VCC in potential. Also, the pre-charged equalizing circuit 10 and the first and second flash write transistors Q7 and Q8 turn into an ON state, and the NMOS transistor Q9 of the potential changeover circuit 16 turns into an ON state, so that the potential of the output node 16a becomes VBL. As a result, the paired bit lines on the side of the P-channel sense amplifier 11 are pre-charge equalized to have the bit line potential VBL through the pre-charge equalizing circuit 10. The paired bit lines on the side of the N-channel sense amplifier 12 are pre-charged with bit line potential VBL through the potential changeover circuit 16 and the first and second flash write transistors Q7 and Q8. At this time, since the control signal ϕT is at "H" level and the bit line transfer gates Q1 and Q2 are in an ON state, the paired bit lines on the side of the N-channel sense amplifier 12 and those on the side of the P-channel sense amplifier 11 are equalized to have the same potential VBL through the bit line transfer gates Q1 and Q2.

The above-described operation in the flash write mode enables the flash write operation and the following bit line pre-charge equalizing operation to be carried out normally.

Namely, in the VRAM according to this embodiment, the transistors Q7 and Q8 have not only an original flash write function but also a bit line equalizing function. This makes it possible to pre-charge bit lines sufficiently in a short period of time even when the power source potential is low, and to sense data read from memory cells with precision.

In addition, there is no need to provide a voltage booster circuit which increases the gate potential of the bit line transfer gate transistors Q1 and Q2 to greater than VCC+Vth only for a predetermined period of time so as to operate the transistors Q1 and Q2 in a triode region when the power source potential is low. Without a voltage booster circuit, problems related to malfunctions caused by power source noise which occur at the time of data output do not occur.

Furthermore, there exist bit line transfer gate transistors Q1 and Q2 as in the conventional device and apparent bit line capacity at the initial sense operation of the sense amplifiers is reduced, thereby preventing the margin of the sense amplifiers at the initial sense operation from decreasing.

Moreover, it is possible to provide, outside the memory cell array, the two NMOS transistors Q9 and Q10 of the potential changeover circuit 16, which are additionally provided with the memory device of the present invention. Therefore, there is no need to increase the number of circuits within the memory cell array. Besides, since the potential changeover circuit 16 has a relatively simple structure, malfunctions caused by noise do not easily occur.

Another embodiment of present invention is explained as follows.

A semiconductor memory device comprising: a pair of bit lines; a plurality of dynamic type memory cells connected to the bit lines, each having a capacitor and a transistor connected in series; a sense amplifier circuit connected to the pair of bit lines, for amplifying a potential difference between the bit lines; a first MOS transistor connected between one of the bit lines and a common source node; a second MOS transistor connected between the other one of the bit lines and the common source node; a first circuit for supplying the common source node with a first potential or a second potential, the first potential is an intermediate potential the level of which is between a ground potential and a power supply potential, the second potential is the ground potential or the power supply potential; and a second circuit for controlling the gates of the first and the second MOS transistors.

The semiconductor memory device according to the above, wherein the sense amplifier circuit consists of a first conductivity type sense amplifier circuit having third and fourth MOS transistors of a first conductivity type which are cross coupled and are connected in series between the pair of bit lines, and a second conductivity type sense amplifier circuit having fifth and sixth MOS transistors of a second conductivity type which are cross coupled and are connected in series between the pair of bit lines.

The semiconductor memory device according to the above, further comprising seventh and eighth transistors which are inserted between the first conductivity type sense amplifier circuit and the second conductivity type sense amplifier circuit.

A further embodiment regarding a method is as follows.

A method for controlling a semiconductor memory device comprising: a pair of bit lines; a plurality of dynamic type memory cells connected to the bit lines, each having a capacitor and a transistor connected in series; a sense amplifier circuit connected to the pair of bit lines, for amplifying a potential difference between the bit lines; a first MOS transistor connected between one of the bit lines and a common source node; and a second MOS transistor connected between the other one of the bit lines and the common source node; the method comprising: in a first mode, supplying the common source node with an intermediate potential the level of which is between a ground potential and a power supply potential, and turning both of the first and the second MOS transistors on; and in a second mode, supplying the common source node with the ground potential or the power supply potential, and making one of the first and the second MOS transistors on in response to an externally supplied write data.

As described so far, according to the semiconductor memory device of the present invention, it is possible to pre-charge bit lines reliably in a short period of time even when the power source potential is low, and to sense and output data read from memory cells precisely, without increasing the number of circuits within the memory cell array, and by only adding to the device such a potential changeover circuit that has a relatively simple structure and is tolerant of noise.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

I claim:

1. A semiconductor memory device comprising:

a memory cell array having memory cells of dynamic type arranged in rows and columns;

a plurality of bit line pairs, each of the bit line pairs being connected to the memory cells in the same column;

a plurality of column selecting transfer gate pairs, each of the column selecting transfer gate pairs being connected to one end of one of the bit line pairs;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time;

a plurality of first and second flash write MOS transistors, one end of each of the first flash write MOS transistors being connected to a first line of one of the bit line pairs in the second portion thereof, and one end of each of the second flash write MOS transistors being connected to a second line of one of the bit line pairs in the second portion thereof;

a flash write control circuit switching the first and second flash write MOS transistors during the pre-charge equalizing period in accordance with write data in a non-flash write mode and in a flash write mode; and a potential changeover circuit having an output node connected to the other ends of the first and second flash write MOS transistors, the potential changeover circuit being capable of setting a potential of the output node to one of a bit line pre-charge potential, which is used to set an initial bit line potential, and a predetermined reference potential, wherein the potential changeover circuit includes:
a third MOS transistor connected between a node supplied with the bit line pre-charge potential and the output node, and having a gate supplied with a first control signal; and
a fourth MOS transistor connected between a node supplied with the predetermined reference potential and the output node, and having a gate supplied with a second control signal.

2. A semiconductor memory device comprising:

a memory cell array having memory cells of dynamic type arranged in rows and columns;

a plurality of bit line pairs, each of the bit line pairs being connected to the memory cells in the same column;

a plurality of column selecting transfer gate pairs, each of the column selecting transfer gate pairs being connected to one end of one of the bit line pairs;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time;

a plurality of first and second flash write MOS transistors, one end of each of the first flash write MOS transistors being connected to a first line of one of the bit line pairs in the second portion thereof, and one end of each of the second flash write MOS transistors being connected to a second line of one of the bit line pairs in the second portion thereof;

a flash write control circuit switching the first and second flash write MOS transistors during the pre-charge equalizing period in accordance with write data in a non-flash write mode and in a flash write mode; and a potential changeover circuit having an output node connected to the other ends of the first and second flash write MOS transistors, the potential changeover circuit being capable of setting a potential of the output node to one of a bit line pre-charge potential, which is used to set an initial bit line potential, and a predetermined reference potential, wherein the flash write control circuit controls the first and second flash write MOS transistors to be in an ON state during the pre-charge equalizing period, to be in an OFF state in the non-flash write mode, and to be selectively in an ON state for a predetermined time before the sense amplifiers are driven in the flash write mode, and the potential changeover circuit includes:
a third MOS transistor connected between a node supplied with the bit line pre-charge potential and the output node, and having a gate supplied with a first control signal;
a fourth MOS transistor connected between a node supplied with the predetermined reference potential and the output node, and having a gate supplied with a second control signal; and
a control signal generation circuit for generating the first and second control signals.

3. The semiconductor memory device as defined in claim 3, wherein the control signal generation circuit controls, during the pre-charge equalizing period and in the non-flash write mode, the third MOS transistor to be in an ON state and the fourth MOS transistor to be in an OFF state, and the control signal generation circuit controls, in the flash write mode, the third MOS transistor to be in an OFF state and the fourth MOS transistor to be in an ON state for a predetermined time.

4. The semiconductor memory device as defined in claim 3, wherein the potential changeover circuit is provided outside of the memory cell array to prevent an increase in the size of the memory cell array.

5. A semiconductor memory device comprising:

a memory cell array having memory cells of dynamic type arranged in rows and columns;

a plurality of word lines, each of the word lines being connected to the memory cells in the same row;

a plurality of bit line pairs, each of the bit line pairs being connected to the memory cells in the same column;

a plurality of column selecting transfer gate pairs, each of the column selecting transfer gate pairs being connected to one end of one of the bit line pairs in series;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time; and potential setting means connected to lines of each of the bit line pairs in the second portion thereof, for either setting data by applying a predetermined potential to one line of each of the bit line pairs in the second portion thereof, or for pre-charge equalizing the second portion of the bit line pairs by applying a pre-charge potential to both lines of the bit line pairs in the second portion thereof, wherein the potential setting means includes:

changeover means for supplying a to-be-set potential to the bit line pairs, the changeover means being connected to lines of each of the bit line pairs in the second portion thereof;

a flash write control circuit controlling the changeover means; and a potential changeover circuit for changing a voltage applied to the changeover means.

6. A semiconductor memory device comprising:

a memory cell array having memory cells of dynamic type arranged in rows and columns;

a plurality of word lines, each of the word lines being connected to the memory cells in the same row;

a plurality of bit line pairs, each of the bit line pairs being connected to the memory cells in the same column;

a plurality of column selecting transfer gate pairs, each of the column selecting transfer gate pairs being connected to one end of one of the bit line pairs in series;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time; and potential setting means connected to lines of each of the bit line pairs in the second portion thereof, for either setting data by applying a predetermined potential to one line of each of the bit line pairs in the second portion thereof, or for pre-charge equalizing the second portion of the bit line pairs by applying a pre-charge potential to both lines of the bit line pairs in the second portion thereof, wherein, in a first mode, the potential setting means applies the pre-charge potential to both lines of the second portion of the bit line pairs, the pre-charge potential being applied to both lines of the first portion of the bit line pairs, which have the pre-charge potential set by the pre-charge equalizing circuit, through the conductive bit line transfer gate pairs.

7. A semiconductor memory device comprising:

a memory cell array having memory cells of dynamic type arranged in rows and columns;

a plurality of word lines, each of the word lines being connected to the memory cells in the same row;

a plurality of bit line pairs, each of the bit line pairs being connected to the memory cells in the same column;

a plurality of column selecting transfer gate pairs, each of the column selecting transfer gate pairs being connected to one end of one of the bit line pairs in series;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time; and potential setting means connected to lines of each of the bit line pairs in the second portion thereof, for either setting data by applying a predetermined potential to one line of each of the bit line pairs in the second portion thereof, or for pre-charge equalizing the second portion of the bit line pairs by applying a pre-charge potential to both lines of the bit line pairs in the second portion thereof, wherein, in a second mode, the potential setting means sets a potential of a first bit line of the second portion of the bit line pairs at the predetermined potential if data is set at "0" and sets a potential of a second bit line of the second portion of the bit line pairs at the predetermined potential if data is set at "1", the potential of the first and second bit lines of the second portion of the bit line pairs being applied to the first portion of the bit line pairs through the bit line transfer gate pairs if the pre-charge equalizing circuit is in an OFF state.

8. A semiconductor memory device comprising:

a memory cell array having memory cells of dynamic type arranged in rows and columns;

a plurality of word lines, each of the word lines being connected to the memory cells in the same row;

a plurality of bit line pairs, each of the bit line pairs being connected to the memory cells in the same column;

a plurality of column selecting transfer gate pairs, each of the column selecting transfer gate pairs being connected to one end of one of the bit line pairs in series;

a plurality of data line pairs, each of the data line pairs being connected to one of the column selecting transfer gate pairs;

a plurality of bit line transfer gate pairs of a first conductivity type, each of the bit line transfer gate pairs being inserted into lines of one of the bit line pairs in series, to divide the bit line pair into a first portion on the side of the memory cells and a second portion on the side of the column selecting transfer gate pairs;

a plurality of bit line pre-charge equalizing circuits, each of the bit line pre-charge equalizing circuits being connected to the first portion of one of the bit line pairs, and being controlled to be in an ON state during a pre-charge equalizing period;

a plurality of bit line potential sense amplifiers, each of the bit line potential sense amplifiers being connected to the second portion of one of the bit line pairs, and being driven for a predetermined time; and potential setting means connected to lines of each of the bit line pairs in the second portion thereof, for either setting data by applying a first predetermined potential to one line of each of the bit line pairs in the second portion thereof, or for pre-charge equalizing the second portion of the bit line pairs by applying a pre-charge potential to both lines of the bit line pairs in the second portion thereof, wherein, in a third mode, the potential setting means disconnects an output potential from the bit line pairs, and the first portion of the bit line pairs is set at a second predetermined potential by a predetermined circuit, irrespective of the potential setting means.

9. The semiconductor memory device as defined in claim 5, wherein the changeover means includes:

a first MOS transistor having a first conductive terminal connected to a first bit line of the bit line pairs in the second portion thereof; and a second MOS transistor having a first conductive terminal connected to a second bit line of the bit line pairs in the second portion thereof;

second conductive terminals of the first and second MOS transistors being connected, in common, to an output terminal of the potential changeover circuit, and control terminals of the first and second MOS transistors being connected to an output of the flash write control circuit.

10. The semiconductor memory device as defined in claim 5, wherein all members of the potential setting means except for the changeover means are provided outside of the memory cell array, to prevent an increase in the size of the memory cell array.

11. The semiconductor memory device as defined in claim 9, wherein in a first mode, the potential setting means controls the first and second MOS transistors to be conductive, sets an output voltage of the potential changeover circuit as the pre-charge potential, and applies the pre-charge potential to both lines of the second portion of the bit line pairs; and in a second mode, if data is to be set at "1", the potential setting means controls the first MOS transistor to be conductive and the second MOS transistor to be non-conductive, and applies the predetermined potential outputted from the potential changeover circuit to first bit lines of the second portion of the bit line pairs, and if data is to be set at "0", the potential setting means controls the second MOS transistor to be conductive and the first MOS transistor to be non-conductive, and applies the predetermined potential outputted from the potential changeover circuit to second bit lines of the second portion of the bit line pairs.

12. The semiconductor memory device as defined in claim 9, wherein the flash write control circuit controls the first and second MOS transistors such that:

in a first mode, the first and second MOS transistors are conductive;

in a second mode, the first and second MOS transistors are selectively conductive; and in a third mode, both of the first and second MOS transistors are non-conductive.

13. The semiconductor memory device as defined in claim 9, wherein, in a third mode, the potential setting means controls the first and second MOS transistors to be non-conductive, and the first portion of the bit line pairs is set at a potential corresponding to a predetermined data, irrespective of the potential setting means.

* * * * *